United States Patent [11] 3,573,569

[72] Inventors Roland O. Davis
Mt. Clemens;
George Spira, Goleta, Calif.

[21] Appl. No. 849,368
[22] Filed Aug. 12, 1969
[45] Patented Apr. 6, 1971
[73] Assignee General Motors Corporation
Detroit, Mich.

[54] CONTROLLED RECTIFIER MOUNTING ASSEMBLY
6 Claims, 5 Drawing Figs.

[52] U.S. Cl. .......... 317/234, 317/235, 321/8
[51] Int. Cl. .......... H01l 1/12, H01l 1/14
[50] Field of Search .......... 317/234, 235, 1, 4, 4.1, 5, 5.4, 6, 11; 321/8

[56] References Cited
UNITED STATES PATENTS
3,471,757 10/1969 Sias .......... 317/234

*Primary Examiner*—James D. Kallam
*Assistant Examiner*—R. F. Polissack
*Attorneys*—E. W. Christen, Creighton R. Meland and Robert W. Smith

ABSTRACT: A mounting assembly for power semiconductor devices forming a power supply circuit includes a first series of solid conductor mounting plates and a second series of insulated mounting plates for supporting pressure contact-type semiconductors in thermal and electrical conducting relationships. Pressure is evenly applied across the semiconductor devices which are arranged in a plurality of stacks. A cooling arrangement is included in the assembly to increase heat dissipation from both sides of each semiconductor.

Patented April 6, 1971 3,573,569

2 Sheets-Sheet 1

INVENTORS
Roland O. Davis &
George Spira
BY
Robert W. Smith
ATTORNEY

INVENTORS
Roland O. Davis &
BY George Spira
Robert W. Smith
ATTORNEY

CONTROLLED RECTIFIER MOUNTING ASSEMBLY

This invention relates to mounting assemblies for semiconductor devices and more particularly to a mounting assembly for a power supply circuit including pressure contact-type semiconductor devices.

Improvements in the power-handling capacity of semiconductor devices have been advantageous in developing the use of semiconductors in power supply circuits intended for heavy duty applications which heretofore were impractical or impossible. The mounting and packaging of such semiconductor circuits are closely associated with the development of higher power-handling capacity of semiconductors and the cost and rating of the particular semiconductors which are used. Also, the size, cooling capabilities, and ruggedness of the circuit mounting assembly are all factors which must be considered in improving the practical application of semiconductor circuits. The improved power supply systems which include semiconductor inverter and converter circuits are typically utilized in supplying heavy duty electrical loads such as electric motor drives for fans, pumps, machine tools and electric vehicles.

Semiconductor circuits designed for heavy duty electrical applications generally include silicon power semiconductor devices having large area wafers of silicon semiconductor material. These power semiconductor devices employ large area heat sink electrodes, usually formed of copper, in contact with both sides of the semiconductor wafer. Because of stresses developed on the wafer by variation of temperatures, the electrical and thermal contact between the power electrodes and the wafer is provided by applying external pressure on the electrodes rather than by soldering or welding the electrodes directly to the wafer. This permits a sliding action to relieve shear stresses which develop in the wafer. These devices are generally formed with a disc-shaped casing having flat electrodes on either side so that both sides can be cooled.

Accordingly, a packaging and mounting assembly which supports pressure contact semiconductor devices must provide interconnection of the flat electrodes in a particular circuit arrangement and also provide cooling at the electrode surfaces to obtain the maximum power-handling capacity, reliability and use of lower cost semiconductors. Without proper cooling, the semiconductor devices must be operated at lower than rated current carrying capacity so that stresses are not developed which will cause damage to the semiconductor wafer assembly.

In order to provide a semiconductor circuit mounting assembly which is compact, has minimum weight and which provides the proper mounting of the semiconductor devices, each of the mounting and supporting members of the assembly must provide multiple functions. The mounting and supporting members of the assembly must provide proper pressure on both sides of each semiconductor, the proper electrical contact, cooling, and permit simple electrical connections between the semiconductor devices and external circuits.

In the present invention, a mounting assembly for a semiconductor power supply circuit includes a single compact arrangement which includes stacks of disc-shaped semiconductor controlled rectifiers having pressure contact-type electrodes. The stacks of semiconductor devices are axially aligned and include groups of semiconductor devices aligned in side-by-side relationship with each group being clamped between two mounting plates. The mounting plates are also stacked so that both sides of each plate, except the end plates, support adjacent groups of semiconductor devices. In one series of mounting plates, each plate includes a common electrical conductor which forms a single junction for connecting both of the adjacent semiconductor groups. In a second series of plates, each plate includes a plurality of conductive inserts which are insulated forni each other to provide a common junction between a pair of adjacent semiconductors which are included in adjacent groups. The two types of mounting plates are arranged alternately between the stacked semiconductor devices to interconnect them in a desired power supply circuit configuration. Insulated end plates having threaded rods and nuts are provided for clamping the assembly of mounting plates and the semiconductor devices together. Passages provided in each of the mounting plates are connected by slidable couplings so that heat is conducted from both sides of each power semiconductor device by a liquid coolant which is circulated through the assembly. The rods extend through the mounting plates and are secured by the clamping nuts so that the semiconductor devices are held together with a predetermined amount of pressure being applied across each device. This provides electrically and thermally conductive connections between the electrodes and the mounting plates and the proper contact pressure between the electrodes and the wafer assembly of each semiconductor.

Accordingly, it is an object of this invention to provide an improved mounting assembly for pressure contact semiconductor devices which is compact and provides both thermal dissipation and simple electrical interconnections for forming a power supply circuit arrangement.

A further object of this invention is to provide an improved semiconductor mounting assembly which includes stacks of pressure contact power semiconductor devices supported between mounting plates which interconnect predetermined groups of semiconductors in a power supply circuit arrangement and conduct heat from both sides of each device to increase the power handling capability of the semiconductor devices.

A further object of this invention is to provide a mounting assembly for power supply converter circuit power semiconductor controlled rectifiers connected between an electrical source and a load in which a minimum of weight and space is required for the assembly and which includes semiconductor mounting plates having passages for conducting a liquid coolant which rapidly conducts heat from the controlled rectifiers when conducting high levels of load current.

And a still further object of this invention is to provide a mounting and packaging assembly for a polyphase power supply frequency converter and cycloconverter circuits formed by semiconductor-controlled rectifier devices connected between a series of alternately arranged solid mounting plates and insulated mounting plates having conductive inserts for supporting the semiconductor devices in axially aligned stacks with pressure being applied across the ends of the semiconductor stacks and for providing heat sink mountings with passages for conducting a coolant in which the passages are interconnected by slidable couplings to allow for variations in the spacing between the mounting plates when pressure is applied across the assembly.

These and other objects of this invention will become apparent from the following description taken in connection with the drawings, in which.

Figure 1:
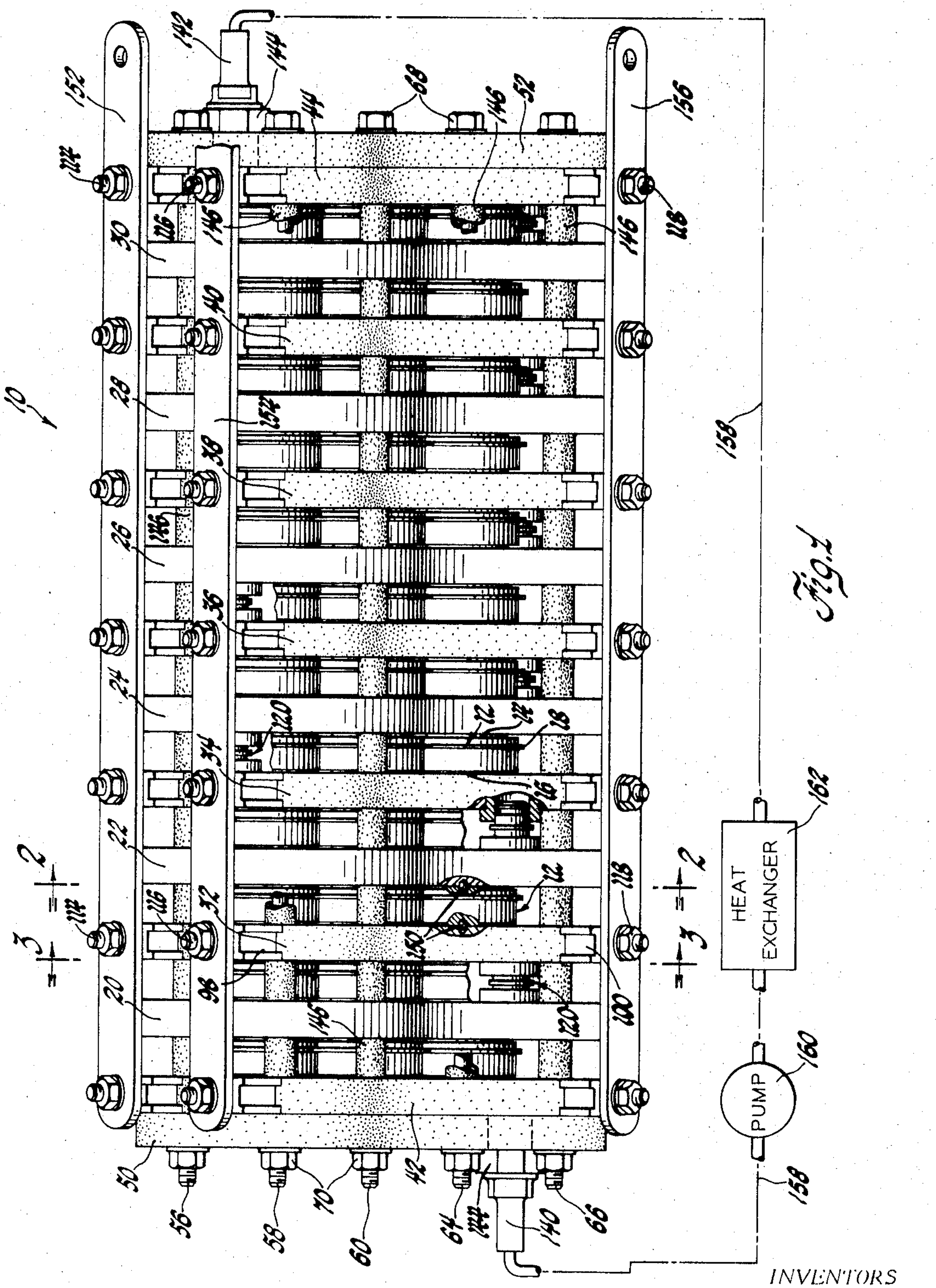
FIG. 1 is a side elevational view, partially in section, of the semiconductor mounting assembly of this invention.

Referring now to the drawings, there is shown in FIG. 1 the semiconductor mounting assembly of this invention which is generally designated by the numeral 10. The mounting assembly 10 supports 36 power semiconductor devices 12 forming a power supply circuit which in a preferred embodiment includes a frequency converter circuit which is the type referred to as a polyphase cycloconverter circuit. The power semiconductor devices 12 are pressure contact thyristors of the silicon-controlled rectifier (SCR) type. These controlled rectifiers are capable of conducting load currents in an order of magnitude in excess of 300 to 400 amperes.

Figures 2, 3, 4, 5:
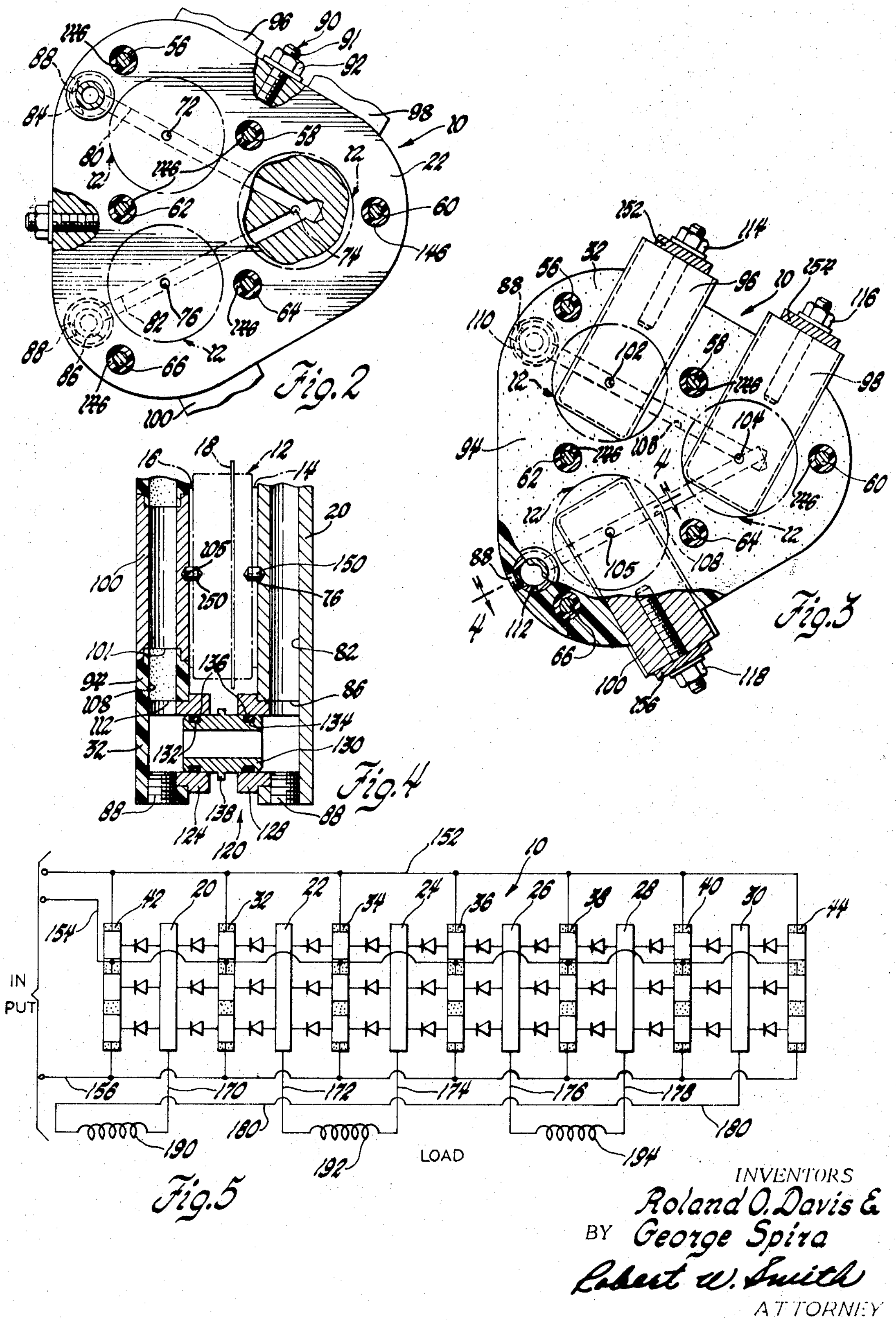
FIG. 2 is a sectional view taken along line 2–2 of FIG. 1 looking in the direction of the arrows.
FIG. 3 is a sectional view taken along the line 3–3 of FIG. 1 looking in the direction of the arrows.
FIG. 4 is an enlarged fragmentary sectional view of the mounting assembly of this invention shown in FIG. 1.
FIG. 5 is a schematic diagram illustrating the embodiment of the invention shown in FIG. 1.

FIG. 4 illustrates in phantom lines the outline of one of the controlled rectifiers 12 which is conventional type having a disc-shaped casing. Each controlled rectifier includes flat anode and cathode end electrodes 14 and 16, respectively, on opposite sides of the semiconductor casing. The casing houses a semiconductor wafer assembly mounting between the end electrodes and includes a gate electrode 18 secured to the casing. The end electrodes provide both a large heat-sink area and load current connections with the semiconductor wafer assembly when pressure is applied to the electrodes to form a compression bond with the wafer. The compression bond provides a sliding contact which reduces shear stresses in the wafer assembly caused by temperature variations developed by heat generated in the wafer assembly.

The controlled rectifiers are assembled within the mounting assembly 10 in three stacks respectively including twelve controlled rectifiers in axial alignment. The three stacks are arranged substantially parallel so that each controlled rectifier is laterally arranged with two other controlled rectifiers to form groups or rows of three controlled rectifiers in side-by-side relationship, for reasons that will be explained further hereinbelow.

The mounting assembly 10 includes a first series of six substantially identical mounting plates designated 20, 22 24, 26, 28 and 30, a second series of five substantially identically shaped mounting plates designated 32, 34, 36, 38 and 40, and two end mounting plates 42 and 44 which are modifications of the second series mounting plates 32 through 40. The 36 controlled rectifiers 12 which form the three stacks of semiconductor devices are mounted between the axially aligned first series and second series of mounting plates.

Each of the plates of the first series of mounting plates 20 through 30 is formed by a solid plate of thermally and electrically conductive material such as aluminum. Each plate of the second series mounting plates 32 through 40 and also the two end mounting plates 42 and 44 include plates formed of an insulating material such as a phenolic composition. The outer sides of the end mounting plates 42 and 44 are engaged by assembly end plates 50 and 52 also made of an insulating phenolic material. The assembly end plates 50 and 52 in combination with six tie rod bolts 56, 58, 60, 62, 64 and 66, having head portions 68 and nuts 70, form a pressure-applying means for securing the assembly together and also applying compression forces to the ends of the controlled rectifiers. All of the mounting plates and the end plates 50 and 52 are substantially the same size and shape which is a rounded triangular configuration as illustrated in the assembly sectional views of FIGS. 2 and 3.

The details of the mounting assembly 10 are illustrated in FIGS. 2, 3 and 4. A solid aluminum conductor plate 22 is shown in FIG. 2 which is typical of each of the first series of mounting plates 20, 22, 24, 26, 28 and 30. Three equidistantly spaced pairs of recessed holes 72, 74 and 76 are partially drilled into both sides of the plate 22. The pairs of holes 72, 74 and 76 are centered with respect to the center of the plate and the holes on each side forming a pair are mutually aligned. These holes are referred to hereinafter as locater holes since they are used in positioning the center of each controlled rectifier 12, as illustrated by the three phantom line circles.

The plate 22 includes six holes extending through the plate to receive the six tie bolts 56, 58, 60, 62, 64 and 66. The tie bolt holes are spaced such that three are three such holes equally spaced from each of the locater holes 72, 74 and 76. The radial distance of the tie bolt holes from the locater hole is such that they are symmetrically oriented outside the casing of each of the three controlled rectifiers.

Internal passages 80 and 82 are provided in the plate 22 by converging blind holes drilled laterally into the edge of the plate. The passages 80 and 82 respectively extend under locater holes 72 and 76 and converge under the locater hole 74. An axial opening 84 is formed on one side of the plate 22 near the outer plate edge that extends into the passage 80. A corresponding axial opening 86 extends into the passage 82 on the opposite side of the plate. The outer ends of the passages are tapped to provide internal threads and set screws 88, shown in FIG. 4, are applied to the internally threaded ends of each passage to plug the passages and to thereby form a continuous passage through the plate and between the openings 84 and 86.

An electrical terminal 90 is provided on the edge surface of plate 22 by a threaded stud 91 and nut 92. The stud 91 is applied to a threaded opening provided in the edge of the plate.

In FIG. 3, the mounting plate 32 is illustrated and, as noted hereinabove is typical of each one of the series of plates 32, 34, 36, 38 and 40. The plate 32 includes an insulating body portion 94 of a phenolic insulating material and includes three conductive inserts 96, 98 and 100. The conductive inserts are made of a thermally and electrically conductive material such as aluminum having the same thickness as that of the body portion 94. Three rectangular shaped notches are provided in the body 94 to receive the conductive inserts 96, 98 and 100. As shown in FIG. 4, the inserts are provided with grooved edge surfaces which mate with a flat ridge portion formed in body portion 94 so that a complementary tongue and groove engagement 101 is provided between the edges of the conductive inserts and the edge of each of the notches. The conductive inserts are placed in the notches and cemented in place with a suitable adhesive.

Pairs of locater holes 102, 104 and 105, respectively, are provided on opposite faces of the conductive inserts 96, 98 and 100. These holes are axially aligned and extend part way into the insert to be respectively aligned with the locater holes 72, 74 and 76 of the first series of mounting plates when it is placed in an assembled position.

Passages 106 and 108 are oriented in the plate 32 in the same manner as passages 80 and 82 to extend through the conductive inserts, for example, as is passage 108 of insert 100 illustrated in FIG. 4. The passages 106 and 108 are also plugged by set screws 88 and terminate at axial openings 110 and 112 on opposite sides of plate 32 corresponding to the openings 84 and 86 of the plate 22. Also, six tie bolt holes are provided in the body 94 which align respectively with the tie bolt holes provided in the other mounting members of the assembly to receive the tie bolts 56, 58, 60, 62, 64 and 66.

Electrical terminals 114, 116 and 118 are provided respectively at the ends of the conductive inserts 96, 98 and 100. These terminals are formed in the same manner as the electrical terminal 90 and respectively include a threaded stud which is applied to a tapped hole in the outer end of each insert and a nut which is applied to the stud.

In order to provide interconnection between the passages of each of the mounting plates, a slidable coupling assembly 120 is provided as illustrated in FIG. 4. A pair of coupling bosses 124 and 128 are force fitted in the passage openings of adjacent mounting plates. A tubular coupling 130 is slidably mounted within the aligned openings of two adjacent bosses 124 and 128. The coupling tube 130 is provided with peripheral grooves 132 and 134 at each end which receives an O-ring seal 136 made of a conventional elastomeric material such as rubber. The seals 136 resiliently engage the inner periphery of each of the bosses 124 and 128 to provide a fluid-tight seal between the coupling member 130 and the axial opening of each cooling passage. The coupling tube 130 slides within the boss members so that the mounting plates can be adjusted axially while maintaining a sealed coupling between the respective passages. An annular ridge 138 is provided to limit the depth that the tube 130 can extend into each opening.

The end mounting plates 42 and 44 are made substantially identical to the mounting plate 32 described in connection with FIG. 3 so that only the inner side of each of three conductive inserts supports a controlled rectifier. The passage opening on the outer side of each of the end mounting plates 42 and 44 respectively include extending nipples 140 and 142. The nipples are connected to the sides of each opening by mating threads provided on the inner end of each nipple and in the passage opening.

The assembly end plates 50 and 52, respectively, are provided with the six tie bolt holes as provided in the first and second series of mounting plates and an additional hole for receiving and supporting the nipples 140 and 142. The assembly end plates are fastened respectively to the end mounting plates 42 and 44 by means of nuts 144 applied to the threaded ends of the nipples 140 and 142 extending through the plates 50 and 52.

To assemble the mounting assembly of this invention as illustrated in FIG. 1, the six tie bolts 56, 58, 60, 62, 64 and 66 are applied through the aligned bolt holes of the end mounting plate 44 and assembly end plate 52. The tie bolts are each provided with a sleeve 146 of insulating material so that the bolts are electrically insulated from the solid conductor plates which include the first series of mounting plates 20, 22, 24, 26, 28 and 30. A first group of three controlled rectifiers is positioned next to the conductive inserts 96, 98 and 100 of the end mounting plate 44. The three controlled rectifiers are oriented with a common polarity toward one end of the assembly, for example, the anode ends toward plate 44. A dowl 150 having tapered ends is placed in holes provided in the center of each electrode end as shown in the partially sectioned views of FIG. 1 and in FIG. 4. The dowls 150 also fit into the locater holes provided in the conductor inserts of the plate 44. The tie bolt holes of the solid conductor plate 30 are aligned with the six tie bolts and the plate is mounted over the bolts so that the locater holes 72, 74 and 76 are aligned to receive the dowls 150 of the three controlled rectifiers mounted to the end mounting plate 44. A coupling tube 130 is positioned between the aligned passage openings each including a coupling boss and inserted into the boss openings as the mounting plates 30 and 44 are forced together. Accordingly, the three controlled rectifiers are mounted on the dowls 150 in the aligned locater holes of the two mounting plates 30 and 44 and the passages of the plates are interconnected by a coupling assembly 120. Similarly, the remaining mounting plates are assembled to the tie bolts with the end mounting plate 42 and assembly end plate 50 being the last to be assembled. The groups of three controlled rectifiers are supported between adjacent mounting plates and a coupling assembly 120 extends from both sides of each plate so that a continuous conduit path extends through each mounting plate between nipples 140 and 142. All of the groups of three controlled rectifiers which are placed between adjacent mounting plates include a common electrode end, for example the anode, to the right so that common electrodes of each controlled rectifier are in contact with one side of each mounting plate.

The mounting assembly 10 is clamped together by means of the threaded nuts which apply compressive forces to the assembly end plates 50 and 52. The nuts 78 are tightened carefully so that equal pressure of a predetermined amount is applied across the electrode ends of each of the controlled rectifiers. The clamping pressure applied by each tie bolt is transmitted from the assembly ends through the stacks of controlled rectifiers and the first and second series of mounting plates. The groups of three controlled rectifiers provide a stable three point contact for transmitting pressure between the mounting plates. Since there are three tie bolts equidistantly spaced relative to each controlled rectifier, the pressure will be equally distributed across each individual controlled rectifier. Further, there being three controlled rectifiers in each row or group of controlled rectifiers clamped between adjacent mounting plates there is an equal distribution of pressure transmitted from one row of controlled rectifiers to the adjacent mounting plate throughout the mounting assembly. The axial movement of the mounting members when subjected to the tensioning pressure of the tie bolts is compensated for by the slidable coupling assemblies 120 which interconnect the fluid passages of adjacent sides of each pair of mounting members. The coolant is sealed between adjacent mounting plates by the O-ring seals which form the slidable sealing fit within the respective passages.

The mounting assembly 10 is completed by providing electrical connections including bus bar conductors 152, 154 and 156 which are formed of a conductive material such as aluminum. The bus bars are respectively secured to the axially aligned conductive inserts of the insulated mounting plates by the threaded studs and nuts respectively provided by electrical terminals 114, 116, 118 of each of the insulated mounting plates. The bus bars 150, 152 and 154 also hold the mounting assembly together to provide additional strength to the assembly. Conductors are respectively connected to each of the electrical terminals 90 of the solid conductor plates to provide a frequency converter arrangement understood by those skilled in the art as a polyphase cycloconverter circuit which is explained further hereinbelow.

A schematic diagram of a coolant circulating and heat exchange system is illustrated in the lower portion of FIG. 1. The nipples 140 and 142 extending from the assembly end plates 50 and 52 are connected to the circulating and heat exchange system by a suitable conduit line 158. A pump 160 and heat exchanger apparatus 162 are connected between the nipples 140 and 142. A liquid such as an oil coolant is circulated by the pump 160 through the heat exchanger 162 and through the passages that extend within the mounting plates adjacent both sides of each of the controlled rectifiers. Adjustment of the mounting plates is permitted without loss of coolant by the slidable coupling assemblies 120 provided between the openings on opposite sides of each mounting plate.

Referring now to the schematic diagram of FIG. 5 wherein the electrical connections provided by the mounting assembly of this invention are more clearly illustrated. The bus bar conductors 152, 154 and 156 provide three phase input connections to the cycloconverter circuit formed by the 36 controlled rectifiers supported between the mounting plates as described hereinabove. The bus bars are connected to a source of three-phase power such as provided by power utility companies or engine driven alternators, for example.

The output of the cycloconverter power supply circuit is provided on six cable conductors designated respectively 170, 172, 174, 176 178 and 180. The cable conductors are respectively connected to the single terminal 90 of the solid mounting plates 20, 22, 24, 26, 28 and 30. The output conductors are connected to a polyphase load comprising, for example, a polyphase drive motor having three-phase input windings 190, 192 and 194. The conductors 170 and 180 are connected across input winding 190, conductors 172 and 174 are connected across the winding 192, and the conductors 176 and 178 are connected across the input winding 194. The configuration of the cycloconverter power supply circuit essentially comprises groups of three phase full wave bridge circuits connected between the three phase input conductors 152, 154 and 156 and to each end of the input windings 190, 192 and 194. Accordingly, each solid mounting plate of the first series of mounting plates forms a common bridge output terminal between two groups of three controlled rectifiers poled in opposite polarities so as to provide a connection in either polarity to each phase line of the input. Each of the three conductive inserts of the insulated mounting plates of the second series of mounting plates forms a bridge input terminal for connection to one of the three phase input lines. The conductive inserts of one of the insulated mounting plates form the inputs to two groups of three controlled rectifiers associated with the bridge output mounting plates adjacent either side of an insulated mounting plate.

The gate electrodes of the controlled rectifiers are connected to a triggering source, not shown, to gate the controlled rectifiers in a desired sequence. The triggering signals provide the desired frequencies and wave shapes of the input voltages developed by the power supply circuit across the three phase load windings 190, 194. Where it is desirable to include further circuit components, such as triggering circuit components, such as triggering circuitry, these components can be conveniently mounted on the mounting plates forming the mounting assembly of this invention.

The mounting 10 assembly of this invention provides a number of combined functions so that a compact and lightweight assembly is provided which is highly efficient in reducing the number of wiring connections and in providing an efficient heat exchange and cooling arrangement to conduct heat from both sides of each controlled rectifier. As heat is generated within the semiconductor wafer of each controlled rectifier the heat is conducted from each side of the controlled rectifier to either of the solid conductor plates 20, 22, 24, 26, 28 and 30 and one of the conductive inserts 96, 98 or 100 in one of the second series of mounting plates 32, 34, 36, 38, 40, or in the end mounting plates 42 and 44. Heat is transferred to the liquid coolant which flows through each of the coolant passages in the mounting plates. The coolant is forced by means of the pump 160 through a heat exchanger 162 which radiates the heat to ambient air thereby cooling the liquid coolant. Accordingly, heat is conducted rapidly from both sides of each controlled rectifier so that the controlled rectifier may be safely operated at its rated power capacity. The plates forming the mounting supporting members of the assembly provide a convenient location for supporting resistor, capacitor or inductor components which may be associated with a power supply circuit provided by the assembly of this invention. For example, triggering signals are of a low-level character and it is desirable to have such circuitry located close to the controlled rectifier devices.

The assembly 10 does not require soldering or welding and only a relatively few different parts are used to facilitate manufacturing and assembling operations when producing such assemblies in large quantities. The electrical and thermal connections are easily provided in the mounting of each controlled rectifier device between adjacent mounting plates and the pressure required to be applied to such devices is applied and maintained by the tie bolts and nuts which also support the mounting plates. The coupling assemblies 120 permit axial movement of the mounting plates, which occurs during tensioning of the tie bolts, for example, without effecting the coolant filling the passages of the mounting plates.

While the embodiments of the present invention as herein disclosed constitute a preferred form it is understood that other forms might be adopted.

We claim:

1. A power supply circuit assembly comprising, a plurality of first mounting plates formed of thermally and electrically conductive material, a plurality of second mounting plates each formed of insulating material having a plurality of conductive portions, said first and second mounting plates being axially spaced and alternately disposed, a plurality of groups of pressure contact type of semiconductors, each of said groups of semiconductors being disposed between respective first and second mounting plates with opposite ends of a semiconductor engaging respectively said first mounting plate and a conductive portion of a second mounting plate, and clamping means for applying axial pressure to said unit to thereby apply axial force to said semiconductors through said mounting plate of sufficient magnitude to provide proper operation of said semiconductors, said first mounting plates and said conductive portions of said second mounting plates forming power output and input terminals for said circuit assembly.

2. A mounting assembly for a polyphase frequency converter power supply circuit including three axially aligned stacks of pressure contact semiconductors having oppositely disposed end electrodes in which the semiconductor stacks are formed by groups of three commonly poled semiconductors which are spaced laterally and symmetrically apart, said mounting assembly comprising: a plurality of first mounting means including thermally and electrically conductive members having a first electrical terminal means and opposite side surfaces, each side surface respectively engaging one end of said groups of semiconductors; a plurality of second mounting means, each of said second mounting means including three electrically insulated conductive portions formed of a thermally and electrically conductive material, each of said conductive portions having a second electrical terminal means and opposite side surfaces respectively engaging the ends of a pair of adjacent semiconductors included in one of said stacks of semiconductors, said first and second mounting means being alternately disposed for respectively engaging the opposite ends of said groups of semiconductors; means for applying pressure to the opposite ends of said mounting assembly so that predetermined contact pressure is applied to the end electrodes of said semiconductors, whereby the end electrodes of a first plurality of axially adjacent groups of semiconductors are connected to a common electrical junction by said first mounting means and the three pairs of end electrodes of a second plurality of axially adjacent groups of semiconductors are respectively connected together by said insulated conductive portions of said second mounting means; said second terminal means of each conductive portion associated with one of the semiconductor stacks providing power input terminals for said mounting assembly adapted to be connected with an electrical power source; said first mounting means providing power output terminals which are adapted to be connected to an electrical load.

3. A mounting assembly for a power supply circuit including a plurality of stacks of pressure contact semiconductors having flat end electrodes, said mounting assembly comprising: a plurality of first mounting plates formed of an electrically and thermally conductive material; a plurality of second mounting plates including an insulating plate and a plurality of spaced apart conductive inserts formed of a thermally and electrically conductive material, said first and said second mounting plates including internal passages for conducting a cooling liquid, said passages extending within each of said mounting plates and terminating at a pair of passage openings formed in each of said first and said second mounting plates; means for supporting each of said semiconductors between one of said first mounting plates and a conductive insert of one of said second mounting plates; conduit means connnected between passage openings of mutually adjacent mounting plates; and a pressure applying means for clamping said first and said second mounting plates together when said plurality of stacks of semiconductors are supported therebetween so that operative contact pressure is provided for each of said semiconductor end electrodes; said mounting plate passages and said conduit means forming in a continuous conduit path for conducting a cooling liquid through said mounting assembly.

4. A mounting assembly for a power supply circuit including a plurality of stacks of pressure contact semiconductors having flat end electrodes, said mounting assembly comprising: a plurality of first mounting plates formed of an electrically and thermally conductive material; a plurality of second mounting plates including an insulating plate carrying a plurality of spaced apart conductive inserts formed of a thermally and electrically conductive material, said first and said second mounting plates having internal passages for conducting a cooling liquid, said passages extending within each of said mounting plates and terminating at axially disposed passage openings formed in the sides of each of said first and said second mounting plates; means for supporting each of said semiconductors between one of said first mounting plates and a conductive insert of one of said second mounting plates with the passage openings of adjacent mounting plates being oppositely disposed in axial alignment; a plurality of tubular couplings slidably mounted within the oppositely disposed passage openings of said adjacent mounting plates; and a pressure-applying means for clamping said first and said second mounting plates together when said plurality of stacks of semiconductors are supported therebetween so that operative contact pressure is provided for each of said semiconductor end electrodes; said mounting plate passages and said tubular couplings forming a path for conducting a cooling liquid through said mounting assembly.

5. A mounting assembly for a power supply circuit including a plurality of stacks of pressure contact semiconductors having flat end electrodes wherein said plurality of stacks of semiconductors are formed by groups of laterally arranged semiconductors, said mounting assembly comprising: a plurality of first mounting plates formed of a solid electrically and thermally conductive material, said first mounting plates having opposite side surfaces including areas engaging two axially adjacent groups of semiconductors; a plurality of second mounting plates; said second mounting plates including an insulating plate portion and a plurality of spaced-apart conductive inserts formed of a thermally and electrically conductive material, said conductive inserts including side portions having areas engaging a pair of adjacent semiconductors included in two adjacent groups of semiconductors, said first and said second mounting plates including internal passages for conducting a cooling liquid, said passages extending within each of said mounting plates and between said areas engaging adjacently disposed semiconductors, said passages terminating at axially disposed passage openings formed in the sides of each of said first and said second mounting plates, means for supporting opposite ends of each of said semiconductors between said semiconductor support areas of said first and second mounting plates with the passage openings of adjacent mounting plates being oppositely disposed in axial alignment; a plurality of tubular couplings including annular sealing members at each end thereof, said tubular coupling ends slidably and sealingly mounted within said passage openings of said adjacent mounting plates; a pressure applying means for clamping said first and said second mounting plates together when said plurality of stacks of semiconductors are supported therebetween so that operative contact pressure is provided for each of said semiconductor end electrodes; and means for connecting the mounting plate passages and said tubular couplings in a continuous conduit path for conducting a cooling liquid through said mounting assembly.

6. A mounting assembly for a polyphase frequency converter power supply circuit including three axially aligned and symmetrically spaced stacks of pressure contact semiconductors having oppositely disposed flat end electrodes in which the semiconductors of each stack are poled in a common direction of polarity, said mounting assembly comprising: a plurality of first mounting plates formed of a solid conductive material having opposite flat side surfaces terminating in an edge surface, said side surfaces including locations for respectively supporting two groups of axially adjacent semiconductors included in said three stacks of semiconductors, and said first mounting plates further including a first electrical terminal means; a plurality of second mounting plates respectively including an insulating body portion and three conductive inserts having flat side portions, said insulating body portion having three spaced notches respectively including a shape complementary to the shape of said conductive inserts, said conductive inserts being mounted within said three notches with said flat side portions having locations disposed for engaging and supporting a pair of adjacent semiconductors respectively included in one said stacks of semiconductors said conductive inserts further including a second electrical terminal means; said first and said second mounting plates including internal passages for conducting a liquid coolant, said passages being formed by intersecting holes drilled into the edge surface of each of said first and said second mounting plates to provide a continuous conduit path adjacent the locations for supporting adjacently disposed semiconductors, said passages terminating at first and second axially extending passage openings respectively extending into opposite sides of each of said first and second mounting plates; means mounting each of said semiconductors between one of said first mounting plates and one of said conductive inserts at said supporting locations so that said first and said second mounting plates are alternately disposed for supporting respectively the opposite ends of said semiconductors with a like pair of end mounting plates being provided at the opposite ends of said stacks of semiconductors, the alternately disposed first and second mounting plates having said first and second passage openings of respectively adjacent mounting plates being oppositely disposed and in axially aligned relationship; means for circulating a liquid coolant through said mounting plate passages including a plurality of tubular couplings including annular sealing members at each end thereof, said ends of each tubular coupling reciprocably and sealingly mounted within oppositely disposed passage openings thereby interconnecting said passages of each mounting plate, and means for interconnecting the outer passage openings of said end mounting plates so that a liquid coolant can be circulated adjacent each of said semiconductors; a pressure-applying means including a tie rod means spaced symmetrically with respect to said three stacks of semiconductors and including first and second portions respectively disposed on the outer sides of each of said end mounting plates, and a clamping means being disposed on said tie rod means on the outer side of said end mounting plates for applying force to the end mounting plates so that pressure is applied to the ends of the said semiconductor stacks whereby operative contact pressure is provided at the end electrodes of each of said semiconductors; a three phase conductor means for providing an input to said power supply circuit from a three phase electrical source, said three phase conductor means including a conductor of each phase respectively connected to said second electrical terminal means of the conductive portions of said second mounting plates respectively supporting one of said semiconductor stacks; and a plurality of output conductor means respectively connected to said first electrical terminal means of said first mounting means for connecting said power supply circuit to an electrical load.